(12) United States Patent
Genevaux

(10) Patent No.: US 7,280,387 B2
(45) Date of Patent: Oct. 9, 2007

(54) SRAM CELL COMPRISING A REFERENCE TRANSISTOR FOR NEUTRALIZING LEAKAGE CURRENT AND ASSOCIATED READ AND WRITE METHOD

(75) Inventor: Franck Genevaux, Revel (FR)

(73) Assignee: STMicroelectronics SA, Montrouge (FR)

( * ) Notice: Subject to any disclaimer, the term of this patent is extended or adjusted under 35 U.S.C. 154(b) by 88 days.

(21) Appl. No.: 11/197,737

(22) Filed: Aug. 4, 2005

(65) Prior Publication Data

US 2006/0291273 A1    Dec. 28, 2006

(30) Foreign Application Priority Data

Aug. 4, 2004    (FR) .................................. 04 08605

(51) Int. Cl.
*G11C 11/00* (2006.01)
(52) U.S. Cl. .................................................... 365/154
(58) Field of Classification Search ............ 365/154 O, 365/207, 208, 154
See application file for complete search history.

(56) References Cited

U.S. PATENT DOCUMENTS

| 4,956,815 | A | 9/1990 | Houston |
| 6,198,656 | B1 | 3/2001 | Zhang |
| 6,262,911 | B1* | 7/2001 | Braceras et al. ............. 365/154 |
| 6,707,708 | B1* | 3/2004 | Alvandpour et al. ........ 365/154 |
| 2004/0047176 | A1 | 3/2004 | Alvandpour et al. |

FOREIGN PATENT DOCUMENTS

WO    WO 2004/049348    6/2004

* cited by examiner

*Primary Examiner*—VanThu Nguyen
(74) *Attorney, Agent, or Firm*—Lisa K. Jorgenson; Jon A. Gibbons; Fleit Kain Gibbons Gutman Bongini & Bianco P.L.

(57) ABSTRACT

A memory cell comprises a first inverter (IA) and a second inverter (IB) coupled upside down to each other between a first node (A) and a second node (B), and a first access transistor (TA) having a drain coupled to the first node (A), a gate coupled to a word line (WL) and a source coupled to a bit line (BLREAD). The memory cell also comprises a reference transistor (TC) having a drain coupled to the first node (A) and a source coupled to a reference line (BLREF), a cut-off potential (GND) being applied to a gate of the reference transistor (TC). Moreover, an SRAM cell comprising a reference transistor for neutralizing leakage current and associated read and write method is described.

15 Claims, 2 Drawing Sheets

SRAM CELL COMPRISING A REFERENCE TRANSISTOR FOR NEUTRALIZING LEAKAGE CURRENT AND ASSOCIATED READ AND WRITE METHOD

CROSS-REFERENCE TO RELATED APPLICATIONS

This application is based upon and claims priority from prior French Patent Application No. 04 08605, filed on Aug. 4, 2004 the entire disclosure of which is herein incorporated by reference.

FIELD OF THE INVENTION

The present invention generally relates to SRAM memories and more particularly to a read and write architecture and associated method for a memory cell.

BACKGROUND OF THE INVENTION

A prior art memory cell is shown in FIG. 1. The memory cell includes a first inverter IA and a second inverter IB connected upside down to each other between a first node A and a second node B, and a first access transistor TA having a drain connected to a first node A, a gate connected to a word line WL and a source connected to a bit line BLT. It also has a second access transistor TB having a drain connected to the second node B, a gate connected to the word line WL and a source connected to a second bit line BLF.

FIG. 2 illustrates N+1 memory cells P0, P1, . . . , PN as described here above, associated to form a row of a prior art SRAM memory, the row also comprising a differential read amplifier SA. All the cells P0, P1, . . . , PN are connected to the same bit rows BLF and BLT. However, each cell is connected to a different word line WL0, WL1, . . . , WLN. The amplifier SA is a differential amplifier. It has two differential inputs respectively connected to the first bit line and the second bit line.

To program a memory cell of the row of cells, a potential VDD is applied to the word line WL associated with the cell to be programmed and, depending on the piece of data, 0 or 1, to be programmed in the memory cell, a zero potential (ground connection) or the potential VDD is applied to the first bit line BLT, and a potential is applied to the line BLF that is the inverse of the potential applied to the line BLT. In one example, to program a logic 0 in the cell P0, VDD is applied to the lines WL0, BLF and the line BLT is connected to ground. After the programming of a 0, the cell A is at the 0 potential and the cell B is at the potential VDD.

To read the content of a memory cell, for example that of the cell P0 in FIG. 2, the two bit lines BLF and BLT are first of all pre-charged at a power supply potential VDD. Then, the potential VDD is applied to the corresponding word line WL0 (WL0=logic 1) to select the cell P0 (the other word lines are ground-connected: WL1= . . . =WLN=0) and the two bit lines BLF and BLT are made floating. Since the line WL0 is at the potential VDD, the access transistors TA0, TB0 of the memory cell P0 are on. Furthermore, since the node A0 of the cell P0 is at 0 and the line BLT is at the potential VDD, the two sides of the channel of the transistor TA0 are at a different potential, so that a current IREAD flows in this channel. This current IREAD will discharge the line BLT and thus gradually bring its potential to 0. However, since the node B0 of the cell P0 and the line BLF are at the same potential VDD, the two sides of the channel of the transistor TB0 are at the same potential and no current flows in this channel. The line BLF remains at the potential VDD. At the end of a certain period of time, the amplifier SA in principle detects a difference in potential between the lines BLT, BLF and accordingly produces a piece of data corresponding to the piece of data stored in the memory cell, i.e. a logic 0 if the potential at the line BLF is greater than the potential at the line BLT (this is the case of the cell P0 in FIG. 1), else a logic 1.

The reading is possible only if a potential difference of sufficient amplitude appears between the lines BLT and BLF. Now, because of leaks inherent in the access transistors TA, TB of the memory cells of the row, it is possible that this potential difference will never be sufficient, so that it will not be possible to read a cell accurately.

Indeed, even when it is properly turned off by an appropriate potential applied to its gate, a transistor shows leaks when a difference in potential appears between its drain and its source. In the example of FIG. 2, it is assumed that logic 1 values are stored in the cells P1, . . . , PN: the nodes A1, . . . , AN are thus at 1 and the nodes B1, . . . , BN are at 0. With the cell P0 being selected (WL0=1, the transistors TB1, TBN are off (WL1=0, WLN=0); despite this, leakage currents IOFF1, . . . , IOFFN are set up between the drain and the source of the transistors TB1, . . . , TBN. These currents IOFF are related to the potential difference between the line BLF and the cells TB1, . . . , TBN, and to the leakages inherent in the transistors TB1, TBN. They are identical if the transistors TB1, TBN are identical. They will together gradually discharge the potential of the line BLF. Assuming the worst case, if all the cells P1, . . . , PN store a logic 1, then a current equal to N*IOFF discharges the potential of the line BLF.

Although useful, this prior art SRAM memory cell configuration is not without its shortcomings. One shortcoming is if the current N*IOFF is close to the current IREAD, then the two lines BLT and BLF will get discharged simultaneously and along a similar slope so that the difference in potential between these two lines will never be great enough to enable accurate reading of the content of the memory cell P0.

In order to accommodate this shortcoming, it can be seen in practice that it is necessary to have IREAD/(N*IOFF) greater than 5 to enable accurate reading of a cell of the row of N memory cells. Since the current IOFF cannot be limited (it is inherent to the access transistors), it is necessary to limit the number N of cells associated with the same read amplifier SA to be able to ensure accurate reading of the content of the memory cells. It is therefore necessary either to limit the total number of memory cells of a SRAM memory (which obviously limits its capacity), or to add read amplifiers, leading to an increase in the size (in terms of surface area and volume of silicon occupied) of the memory. By way of an indication, for certain memories, N is limited to 128.

Accordingly, a need exists to overcome the shortcomings of the prior art and to provide a SRAM memory design with improved leakage current characteristics.

SUMMARY OF THE INVENTION

Briefly, the present invention provides a new SRAM memory cell and an associated memory, in which the influence of the leakage currents is neutralized so that they no longer disturb the reading of the memory cell.

The memory cell in accordance with the present invention includes a first inverter (IA) and a second inverter (IB)

connected upside down to each other between a first node (A) and a second node (B), and a first access transistor (TA) having a drain connected to the first node (A), a gate connected to a word line (WL) and a source connected to a bit line (BLREAD).

According to the present invention, the memory cell also comprises a reference transistor (TC) having a drain connected to the first node (A) and a source connected to a reference line (BLREF), a cut-off potential (GND) being applied to a gate of the reference transistor (TC).

As further described in detail below, the use of a reference transistor, enables the subtraction of the contribution made by current leaks if any in the access transistors of the other cells of a same row. This subtraction is carried out in the read amplifier during the reading of the memory cell. It follows from this that current leaks, if any, no longer disturb the reading of a memory cell as shall be seen more clearly in examples below.

The cut-off potential uses either a ground potential (0 potential), or the power supply potential VDD, depending on the type of transistor (N or P) chosen to make the reference transistor.

According to one embodiment of the present invention, the memory cell is complemented by a means for the application, to the word line (WL), of an active potential, which is:
 either (VDD+VT) greater than a power supply potential (VDD), if the first access transistor is of a first type (type N),
 or (−VT) below a ground potential (GND), if the first access transistor is of a second type (type P).

This makes it possible to guarantee accurate programming of the memory cell, whatever the value 0 or 1 to be memorized, as shall be seen more clearly here below.

According to another embodiment of the present invention, the memory cell is complemented by a second access transistor (TB), having a drain connected to the second node (B), a gate connected to the word line (WL) and a source connected to a write line (BL) to which there is applied a write potential that is complementary to the potential applied to the bit line. The second access transistor facilitates the programming of the memory cell because, as in a prior art memory cell design, it is not necessary in this case to have available an active potential greater than the power supply potential. This is more fully described below.

The present invention also relates to a memory comprising a row comprising a read amplifier (SA') and a set of memory cells according to the invention and as described here above. In the memory:
 the first access transistor (TA0, TA1, . . . , TAN) of each memory cell has a gate connected to a word line (WL0, WL1, . . . , WLN) associated with the memory cell, and a source connected to a single bit line (BLREAD), and
 the reference transistor (TC0, TC1, . . . , TCN) of each memory cell has a source connected to a single reference line (BLREF), a same cut-off potential being applied to the gate of the reference transistor (TC0, TC1, . . . , TCN) of each memory cell.

The read amplifier used is a current or voltage differential amplifier; it may also be dissymmetrical.

To read an isolated memory cell, or a memory cell of a memory according to the invention, the bit line (BLREAD) and the reference line (BLREF) are pre-charged by the application to them of a read potential (VDD) then:
 a cell to be read (Pi) is selected by the application of a selection potential (VDD or GND) to a word line (WLi) associated with the cell to be read (Pi),
 the bit line (BLREAD°) and the reference line (BLREF) are made floating, and then:
 a difference is detected in the current flowing in the read line and the current flowing in the reference line, or
 a potential difference is detected between the potential present on the read line and the potential present on the reference line.

The selection potential herein has a value chosen so as to turn on an access transistor. Depending on the embodiment of the access transistor, whether it is an N type or P type transistor for example, the selection potential could be equal to VDD, GND, or any other appropriate potential. Similarly, the value of the potential applied to the bit line and to the reference line is not important. It is enough that this potential should be sufficient to obtain a reading of the cell considered and that the potential should be the same on the bit line and on the reference line. This characteristic is necessary to measure the contribution made by possible current leaks during the reading, the contribution being then eliminated by differentiation in the read amplifier.

To write data to an isolated memory cell or a memory cell of a memory as described here above:
 a cell (Pi) to be read is selected by the application of an active potential on a word line (WLi) associated with the cell to be read,
 a ground potential or a power supply potential (VDD) is applied to the bit line (BLREAD) associated with the cell to be written to, depending on the data to be written.

If the memory cell has no second access transistor, the active potential, depending on the type of first access transistor, is:
 either greater than the power supply potential (VDD), and preferably greater than a power supply potential (VDD) and a threshold potential (VT) of the first access transistor (TAi),
 or lower than the ground potential (GND), and preferably the opposite (−VT) of the threshold potential.

The foregoing and other features and advantages of the present invention will be apparent from the following more particular description of the preferred embodiments of the invention, as illustrated in the accompanying drawings.

BRIEF DESCRIPTION OF THE DRAWINGS

The present invention will be understood more clearly and other features and advantages shall appear from the following description of an exemplary embodiment of a memory cell and a memory according to the invention. The description is read with reference to be appended drawings, of which.

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In all the figures, objects having the same references are identical. The ending number of a reference indicates the rank of the object in question. For example, P1 is a memory cell of rank 1, A1 is the node A of the memory cell P1, etc.

Figure 1:
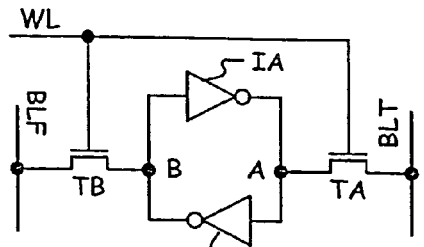
FIG. 1 is a drawing of a prior art SRAM memory cell.
Figure 3:
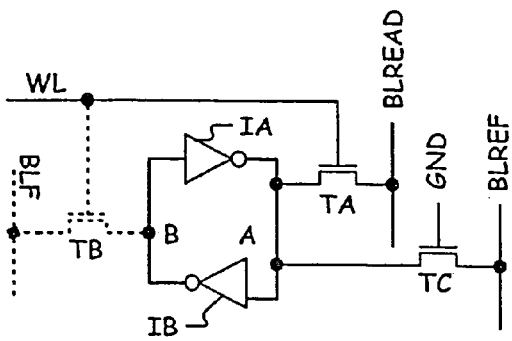
FIG. 3 is a memory cell according to on embodiment of the present invention.
Figure 2:
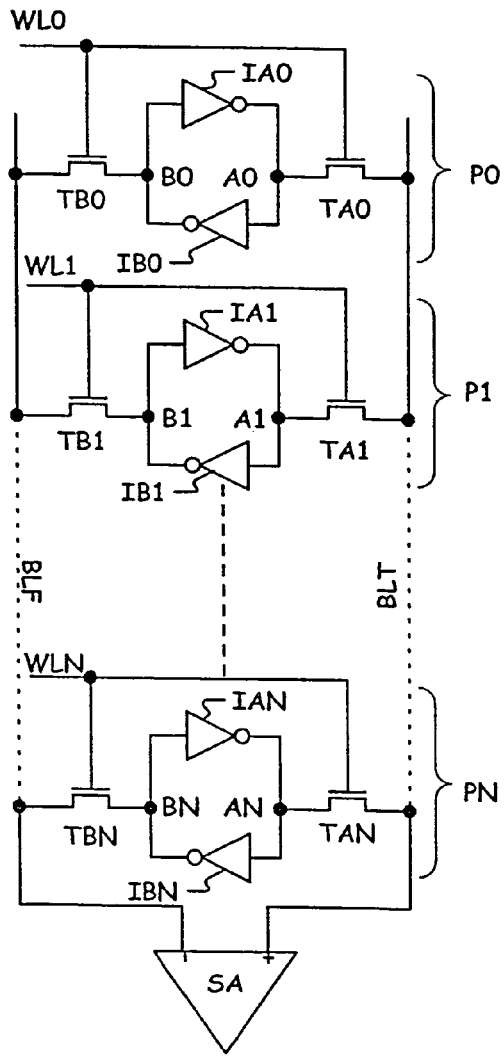
FIG. 2 is a drawing of a row of cells of a prior art SRAM memory cell.

In a memory cell according to the invention (FIG. 3), as compared with a prior art memory cell (FIG. 1), the access transistor TB, connected to the node B of the memory cell, has been replaced by a reference transistor TC, having a drain connected to the node A, its gate connected to the ground and its source connected to a reference line BLREF, the reference line being taken to a reference potential VREF. In the example of FIG. 3, VREF=VDD. If the access transistor TA is a P type transistor, then it is rather VREF=GND that will be chosen. Preferably, the transistors TC and TA are of the same size.

Figure 4:
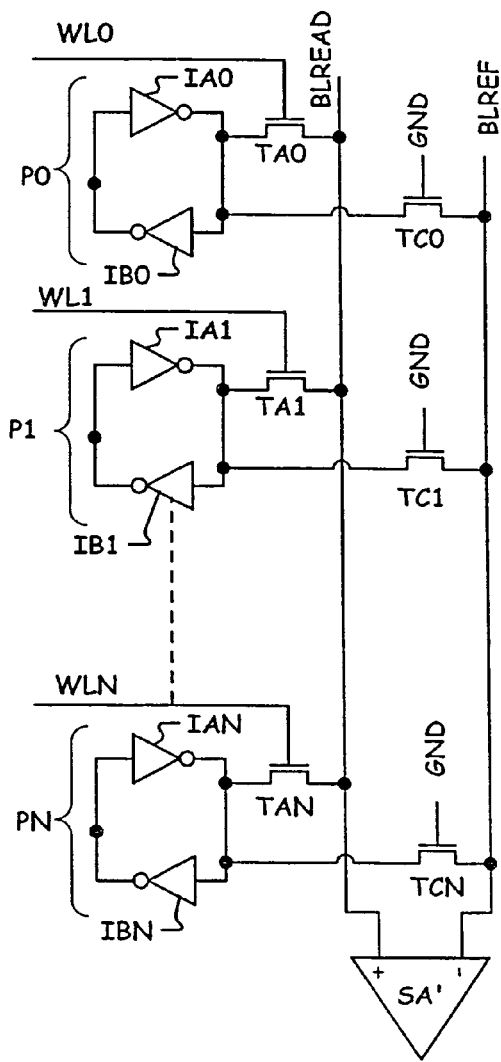
FIG. 4 is a row of cells of a memory according to one embodiment of the present invention.

In one memory according to the invention (FIG. 4), to form a row, N+1 memory cells P0, P1, . . . , PN are connected. These memory cells are made according to the diagram of FIG. 3, and are associated with a read amplifier SA', in a manner fairly similar to what is done for a prior art memory. Thus, or the access transistor is TA0, TA1, . . . , TAN have their drain connected to the bit line BLREAD, and all have their gate connected to a different word line, respectively WL0, WL1, WLN. The bit line BLREAD and reference line BLREF are connected respectively to the positive input and to the negative input of the differential amplifier SA'. In the example of FIG. 4, the amplifier SA' is a current differential amplifier, capable of comparing currents flowing in the lines connected to its inputs. It is also possible to use a voltage differential amplifier.

Furthermore, according to the invention, the transistors TC0, TC1, . . . , TCN of the memory cells all have their gate ground-connected (hence always off) and their source connected to the line BLREF. The transistors TC0, TC1, . . . , TCN are preferably chosen to be respectively identical to the transistors TA0, TA1, . . . , TAN.

The working of a memory cell and of a memory according to the invention shall now be described in the context of a few examples.

In a first example, it is assumed that a 0 is programmed in the cell P0 (hence the node A0 of P0 is at 0 and the node B0 of P0 is at 1) and a 0 is also programmed in each of the other cells P1, . . . , PN of the row of cells. To read the cell P0, first of all the line BLREAD and the line BLREF are precharged by having a read potential VDD applied to them, and then:

the cell P0 to be read is selected by the application of a selection potential (in this case VDD because TA0 is an N type transistor) to the word line WL0 associated with the cell P0 to turn on the transistor TA0, and WL1= . . . =WLN=0 is applied to turn off the access transistors of the cells P1, . . . , PN, the line BLREAD and the line BLREF are made floating and then, depending on the amplifier SA' used:

a difference is detected between the current flowing in the line BLREAD and the current flowing in the line BLREF, or a difference in potential is detected between the potential present on the line BLREAD and the potential present on the line BLREF.

The transistor TA0 perceives different potentials at the ends of its channel (on the one hand the potential 0 at the cell A0, on the other hand, the potential VDD on the line BLREAD); since TA0 is on (WL0=1), the current IREAD flows in TA0. Each of the N transistors TA1, . . . , TAN also perceives different potentials at the ends of its channel (on the one hand the potential 0 at the cell A1, . . . , AN respectively, on the other hand the potential VDD on the line BLREAD; however, since the transistors TA1, . . . , TAN are off (WL1= . . . =WLN=0), only one current IOFF flows in each transistor TA1, . . . , TAN. Finally, the line BLREAD is discharged by the sum of the current flowing in the transistors TA0, TA1, . . . , TAN, i.e. by the current IREAD+N*IOFF.

The transistor TC0 for its part perceives different potentials at the ends of its channel (on the one hand the potential 0 at the cell A0, on the other hand, the potential VDD on the line BLREF); since TC0 is off (its gate connected to the ground GND), the current IOFF flows in TC0. Each of the N transistors TC1, . . . , TCN also perceives different potentials at the ends of its channel (on the one hand the potential 0 at the cell A1, . . . , AN, respectively and, on the other hand, the potential VDD on the reference line); since the transistors TC1, . . . , TCN are off (their gate is ground-connected), only one current IOFF flows in each transistor TC1, . . . , TCN. Finally, the line BLREF is discharged by the sum of the current flowing in the transistors TC0, TC1, . . . , TCN, i.e. by the current (N+1)*IOFF.

The read amplifier SA' thus perceives:

at its positive input, a current for discharging the bit line equal to IREAD+N*IOFF, at its reference input, a current for discharging the reference line equal to (N+1)*IOFF and accordingly produces a current $\Delta I$ equal to the difference, i.e. $\Delta I$=IREAD−IOFF.

In a second example, it is assumed that a 0 is programmed in the cell P0 and a 1 is programmed in each of the other cells P1 to PN. To read the cell P0, the line BLREAD and the line BLREF are precharged at VDD, and then:

WL0=VDD is applied to select the cell P0 and WL1= . . . =WLN=0 is applied to turn off the access transistors of the cells P1, . . . , PN, the line BLREAD and the line BLREF are made floating and then, depending on the amplifier SA' used, a difference in current or voltage is detected between the lines BLREAD and BLREF.

The current IREAD flows in TA0 (because A0 is at the potential 0, BLREAD is at the potential VDD and TA0 is on). Each of the N transistors TA1, . . . , TAN for its part perceives a same potential VDD at the ends of its channel (on the one hand the potential VDD corresponding to a logic 1 at the cell A1, . . . , AN respectively, on the other hand the potential VDD on the line BLREAD). Consequently, no current flows in the transistors TA1, . . . , TAN. Finally, the line BLREAD is discharged by the sum of the current flowing in the transistors TA0, TA1, . . . , TAN, i.e. by the current IREAD+N*IOFF.

The current IOFF flows in TC0 (because A0 is at the potential 0, BLREF is at the potential VDD and TC0 is on), and no current flows in the transistors TC1, TCN (because the cells A1, . . . , AN are at the same potential VDD as the line BLREF). Finally, the line BLREF is discharged by the sum of the current flowing in the transistors TC0, TC1, . . . , TCN, i.e. by the current (N+1)*IOFF.

The read amplifier SA' thus perceives:

at its positive input, a current for discharging the bit line equal to IREAD, at its reference input, a current for discharging the reference line equal to IOFF and accordingly produces a current ΔI equal to the difference, i.e. ΔI=IREAD−IOFF.

In a third example, it is assumed that a 1 is programmed in the cell P0 and that a 1 is programmed in each of the other cells P1 to PN. To read the cell P0, the line BLREAD and the line BLREF are precharged at VDD, and then:

WL0=VDD, WL1= . . . =WLN=0 are applied, the line BLREAD and the line BLREF are made floating and then, depending on the amplifier SA' used, a difference in current or voltage is detected between the lines BLREAD and BLREF.

No current flows in TA0 because A0 is at the potential VDD, BLREAD is at the potential VDD and TA0 is on. No current flows in TA1, . . . , TAN either because the cells A1, AN are at the potential VDD and so is the line BLREAD. Finally, the line BLREAD is discharged by a current equal to 0. Similarly, no current flows in TC0 because A0 is at the potential VDD and so is BLREAD. No current flows in the transistors TC1, . . . , TCN either because the cells A1, . . . , AN are at the potential VDD and so is the line BLREF. Finally, the line BLREF is discharged by a current equal to 0. The amplifier SA' thus perceives zero currents at its two inputs and accordingly produces a current ΔI equal to 0.

In a fourth example, it is assumed that a 1 is programmed in the cell P0 and that a 0 is programmed in each of the other cells P1 to PN. To read P0, the line BLREAD and the line BLREF are precharged at VDD, and then:

WL0=VDD, WL1= . . . =WLN=0 are applied, the line BLREAD and the line BLREF are made floating and then, depending on the amplifier SA' used, a difference in current or voltage is detected between the lines BLREAD and BLREF.

No current flows in TA0 because A0 is at the potential VDD, BLREAD is at the potential VDD and TA0 is on. However, a current IOFF flows in each of the N transistors TA1, . . . TAN because the cells A1, . . . , AN are at the potential 0 and the line BLREAD is at the potential VDD. Finally, the line BLREAD is discharged by a current equal to 0+N*IOFF. Similarly, no current flows in TC0 because A0 is at the potential VDD and so is BLREAD. However, a current IOFF flows in each of the transistors TC1, . . . , TCN because the cells A1, . . . , AN are at the potential 0 and the line BLREF is at the potential VDD. Finally, the line BLREF is discharged by a current equal to 0+N*IOFF.

The read amplifier thus perceives:

at its positive input, a current for discharging the line BLREAD equal to (N)*IOFF, at its reference input, a current for discharging the BLREF equal to (N)*IOFF and accordingly produces a current ΔI equal to the difference, i.e. ΔI=0.

The following table gives a summary view of the four extreme examples described here above. The first column indicates the potential at the point A0, which corresponds to the piece of data to be read; the second column indicates the potential at the points P1 to PN; the third column and the fourth column indicate the bit line and reference line discharge currents; and the fifth column indicates the current produced by the amplifier SA', which corresponds to the data read by the amplifier SA'.

| A0 | Ai, for i ≠ 0 | BLREAD | BLREF | ΔI |
|---|---|---|---|---|
| VDD | VDD | 0 + 0 | 0+ | 0 |
| VDD | 0 | 0 + N*IOFF | 0 + N*IOFF | 0 |
| 0 | VDD | IREAD + 0 | IOFF | IREAD − IOFF |
| 0 | 0 | IREAD + N*IOFF | IOFF + N*IOFF | IREAD − IOFF |

It can clearly be seen in the fifth column that the current read ΔI is independent of N, unlike in the case of the prior art SRAMs: the current ΔI is thus independent of the number of memory cells present in the row or, more specifically, the number N of transistors TA which, during a reading of a cell of the row, perceive different potentials at the ends of their channel and leak when they are off.

The fact that, in a memory according to the invention, the read current is independent of the number of cells is due to the fact that the current leaks in certain transistors TA are compensated for by current leaks of a same quantity in the corresponding transistors TC. It is therefore always possible to read a cell, and the number of cells associated with an amplifier in a same row is no longer limited.

To program a memory cell according to the invention, it is enough to apply the desired potential to the line BLREAD (0 or VDD depending on the value to be programmed at the cell Ai) and apply a potential greater than or equal to VDD+VT to the desired word line WLi, VT being a saturation threshold of the transistor TAi. This high potential VDD+VT is necessary in order to turn on the transistor N of the inverter IA, especially when the value 1 is to be stored in a memory cell previously containing the value 0. Indeed, an N type transistor, in this case the transistor TAi, is on only if there is a potential difference between its drain (the cell Ai) and its gate that is greater than a conduction threshold voltage VT of the transistor. In other words, to program the cell Pi, if VDD is applied to the gate of the transistor TAi, it is possible at best to await VDD−VT at the cell Ai. VDD+VT therefore has to be applied to the gate of TAi to obtain VDD at the cell Ai at the end of programming. A similar mode of reasoning must be applied when the access transistor TAi used is of a P type and when a 0 is to be stored in a memory cell that previously contained a logic 1. If GND is applied to the gate of a P type transistor and GND to its source, it is possible at best to await VT at its drain. −VT must be applied to its gate to attain GND (0) at its drain.

The application of VDD+VT (or −VT as the case may be) to the gate of Tai is of course an efficient approach, but has the drawback of requiring the presence of a potential step-up circuit (or potential step-down circuit as the case may be), for example of the load pump type, in order to raise the power supply potential VDD to VDD+VT (or to lower GND to −VT). This increases the size of the memory from 5% to 10% and, above all, it greatly increases the complexity of the circuit owing to the complexity of the final adjustments made to the load circuit.

Figure 5:
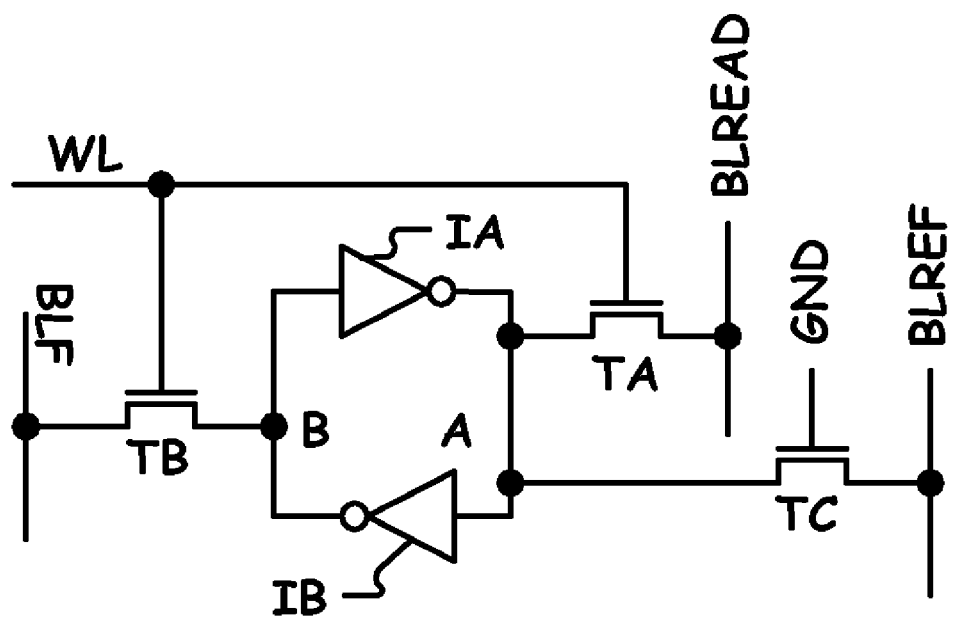
FIG. 5 is a memory cell according to another embodiment of the present invention.

To facilitate the programming of a memory cell according to the invention, it is also possible, as in the past, to add an access transistor TB (shown in dashes in FIG. 3), having a drain connected to node B of the memory cell, its source connected to the programming line BLF (to which there is applied potential complementary to the potential applied to the line BLREAD) and its gate connected to the same word line as the transistor TA to enable the selection of the point. This alternate embodiment of a memory cell is shown in FIG. 5.

In the example of FIG. 4, a current differential amplifier was used. It is also possible to use a voltage differential amplifier which, during a read operation, compares the difference in potential between the line BLREAD and the line BLREF. In this case, such an amplifier outputs a voltage ΔV that may take two values, 0 or VS, VS being a voltage independent of the number N of memory cells in a row.

Again, in the invention, the amplifier used is a dissymmetrical amplifier. Indeed, by the construction of a memory according to the invention, during a read operation, the current flowing in the line BLREAD is always greater than the current flowing in the line BLREF and the potential on the line BLREAD is always lower than the potential on the line BLREF, whatever the value 0 or 1 memorized in the point read.

The method as described above is used in the fabrication of integrated circuit chips.

The resulting integrated circuit chips can be distributed by the fabricator in raw wafer form (that is, as a single wafer that has multiple unpackaged chips), as a bare the, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

The invention claimed is:

1. A memory cell comprising:
    a first inverter and a second inverter cross coupled to each other between a first node and a second node;
    a first access transistor having a drain coupled to the first node, a gate coupled to a word line and a source coupled to a bit line;
    a reference transistor having a drain coupled to the first node and a source coupled to a reference line, and a cut-off voltage potential applied to a gate of the reference transistor; and
    a second access transistor, having a drain coupled to the second node, a gate coupled to the word line and a source coupled to a write line with a write voltage potential that is complementary to a voltage potential applied to the bit line.

2. The memory cell according to claim 1, further comprising:
    a means for the applying an active voltage potential to the word line which is at least one of:
        greater than a power supply voltage potential, in response to the first access transistor being of a first type; and
        below a ground voltage potential, in response to the first access transistor is of a second type.

3. The memory cell according to claim 2, further comprising:
    a row comprising a read amplifier coupled to a plurality of memory cells;
    wherein the first access transistor of each memory cell has a gate coupled to a word line associated with the memory cell, and a source coupled to a single bit line, and
    wherein the reference transistor of each memory cell has a source coupled to a single reference line, a same cut-off voltage potential being applied to the gate of the reference transistor of each memory cell.

4. The memory cell according to claim 3, wherein the read amplifier is at least one of a current differential amplifier and a voltage differential amplifier.

5. The memory cell according to claim 4, wherein the read amplifier is a non-symmetrical amplifier.

6. The memory cell according to claim 3, wherein the read amplifier is a non-symmetrical amplifier.

7. The memory cell according to claim 1, further comprising:
    a row comprising a read amplifier coupled to a plurality of memory cells;
    wherein the first access transistor of each memory cell has a gate coupled to a word line associated with the memory cell, and a source coupled to a single bit line, and
    wherein the reference transistor of each memory cell has a source coupled to a single reference line, a same cut-off voltage potential being applied to the gate of the reference transistor of each memory cell.

8. The memory cell according to claim 7, wherein the read amplifier is at least one of a current differential amplifier and a voltage differential amplifier.

9. The memory cell according to claim 7, wherein the read amplifier is a non-symmetrical amplifier.

10. The memory cell according to claim 1, further comprising:
    a row comprising a read amplifier coupled to a plurality of memory cells;
    wherein the first access transistor of each memory cell has a gate coupled to a word line associated with the memory cell, and a source coupled to a single bit line, and
    wherein the reference transistor of each memory cell has a source coupled to a single reference line, a same cut-off voltage potential being applied to the gate of the reference transistor of each memory cell.

11. A method for reading of a memory cell, the method comprising:
    cross coupling a first inverter and a second inverter to each other between a first node and a second node;
    coupling a drain of a first access transistor to the first node, a gate coupled to a word line and a source coupled to a bit line; and
    coupling a drain of a reference transistor to the first node and a source coupled to a reference line, and a cut-off voltage potential applied to a gate of the reference transistor;
    applying an active voltage potential to the word line which is at least one of:
        greater than a power supply voltage potential, in response to the first access transistor being of a first type; and
        below a ground voltage potential, in response to the first access transistor is of a second type;
    pre-charging the bit line and the reference line by applying a read voltage potential, then:
    selecting a memory cell to be read by the application of a selection voltage potential to a word line associated with the memory cell to be read;
    making the bit line and the reference line floating, and then performing at least one of:

detecting a difference in a current flowing in the read line and the current flowing in the reference line; and detecting a potential voltage difference between the potential present on the read line and the voltage potential present on the reference line.

12. A method for writing data to a memory cell, the method comprising:

cross coupling a first inverter and a second inverter to each other between a first node and a second node;

coupling a drain of a first access transistor to the first node, a gate coupled to a word line and a source coupled to a bit line;

coupling a drain of a reference transistor to the first node and a source coupled to a reference line, and a cut-off voltage potential applied to a gate of the reference transistor;

selecting a memory cell to be written by the application of an active voltage potential to a word line associated with the cell to be read;

applying at least one of a ground voltage potential and a power supply voltage potential to the bit line associated with the cell to be written to, depending on a data value to be written; and applying an active voltage potential to the word line which is at least one of:

greater than a power supply voltage potential, in response to the first access transistor being of a first type; and below a ground voltage potential, in response to the first access transistor is of a second type;

wherein the active voltage potential is at least one of greater than the power supply voltage potential; and below the ground voltage potential, depending on the type of first access transistor.

13. The method according to claim 12, wherein depending on the type of first access transistor, the active voltage potential is at least one of:

greater than a power supply voltage potential, and a threshold voltage potential of the first access transistor; and opposite of the threshold potential.

14. The method according to claim 13, further comprising:

coupling a drain of a second access transistor to the second node, a gate coupled to the word line and a source coupled to a write line with a write potential that is complementary to a voltage potential applied to the bit line; and applying at least one of an active voltage potential equal to the power supply voltage potential and the ground voltage potential to the gate of the first access transistor and the gate of the second access transistor, depending on the type of first access transistor.

15. A method for writing data to a memory cell, the method comprising:

cross coupling a first inverter and a second inverter to each other between a first node and a second node;

coupling a drain of a first access transistor to the first node, a gate coupled to a word line and a source coupled to a bit line;

coupling a drain of a reference transistor to the first node and a source coupled to a reference line, and a cut-off voltage potential applied to a gate of the reference transistor;

selecting a memory cell to be written by the application of an active voltage potential to a word line associated with the cell to be read;

applying at least one of a ground voltage potential and a power supply voltage potential to the bit line associated with the cell to be written to, depending on a data value to be written;

coupling a drain of a second access transistor to the second node, a gate coupled to the word line and a source coupled to a write line with a write potential that is complementary to a voltage potential applied to the bit line; and applying at least one of an active voltage potential equal to the power supply voltage potential and the ground voltage potential to the gate of the first access transistor and the gate of the second access transistor, depending on the type of first access transistor.

* * * * *